(12) United States Patent
Kim et al.

(10) Patent No.: US 8,587,291 B2
(45) Date of Patent: Nov. 19, 2013

(54) APPARATUS FOR DIAGNOSING DC-DC CONVERTER AND METHOD THEREOF

(75) Inventors: Sung Kyu Kim, Gyeonggi-do (KR); Jaewon Lee, Gyeonggi-do (KR); Tae Hwan Chung, Incheon (KR); Ki Jong Lee, Gyeonggi-do (KR); Jong Kyung Lim, Gyeonggi-do (KR)

(73) Assignee: Hyundai Motor Company, Seoul (KR)

( * ) Notice: Subject to any disclaimer, the term of this patent is extended or adjusted under 35 U.S.C. 154(b) by 371 days.

(21) Appl. No.: 12/959,769

(22) Filed: Dec. 3, 2010

(65) Prior Publication Data

US 2011/0316524 A1 Dec. 29, 2011

(30) Foreign Application Priority Data

Jun. 23, 2010 (KR) .................. 10-2010-0059782

(51) Int. Cl.
*G01R 19/18* (2006.01)
(52) U.S. Cl.
USPC ........ 324/120; 324/126; 324/127; 324/117 R; 324/522; 324/713; 363/25; 363/21.01; 363/97; 363/133; 363/66; 323/284
(58) Field of Classification Search
USPC .............. 324/120, 126, 127, 117 R
See application file for complete search history.

(56) References Cited

U.S. PATENT DOCUMENTS

| 4,277,692 | A | * | 7/1981 | Small ...................... 307/66 |
| 5,831,838 | A | * | 11/1998 | Illingworth ............ 363/21.03 |
| 5,963,404 | A | * | 10/1999 | Guzman-Casillas et al. ... 361/35 |
| 7,149,067 | B2 | * | 12/2006 | Faulkner et al. ............ 361/90 |
| 7,312,596 | B2 | * | 12/2007 | Bolz et al. .................. 320/120 |
| 7,542,308 | B2 | * | 6/2009 | Yamada ................... 363/21.01 |
| 2003/0128018 | A1 | * | 7/2003 | Telefus et al. .............. 323/284 |
| 2007/0108991 | A1 | * | 5/2007 | Ball ............................ 324/537 |
| 2007/0159855 | A1 | * | 7/2007 | Odell et al. .............. 363/21.01 |
| 2010/0271007 | A1 | * | 10/2010 | Emoto ...................... 324/127 |

\* cited by examiner

*Primary Examiner* — Arleen M Vazquez
*Assistant Examiner* — Thang Le
(74) *Attorney, Agent, or Firm* — Edwards Wildman Palmer LLP; Peter F. Corless

(57) ABSTRACT

A diagnosis device and method of a voltage transformer can include a current transformer disposed at one side of an output port for generating a current variation according to an on/off operation of a power switch element; a first current detector configured to detect a forward direction current from the current transformer; a second current detector configured to detect a reverse direction current from the current transformer; a first voltage transformer configured to transform the forward direction current detected from the first current detector to a forward direction voltage; a second voltage transformer configured to transform the reverse direction current detected from the second current detector to a reverse direction voltage; and a diagnosis portion for comparing the forward direction voltage with the reverse direction voltage to determine whether or not an offset is formed.

4 Claims, 3 Drawing Sheets

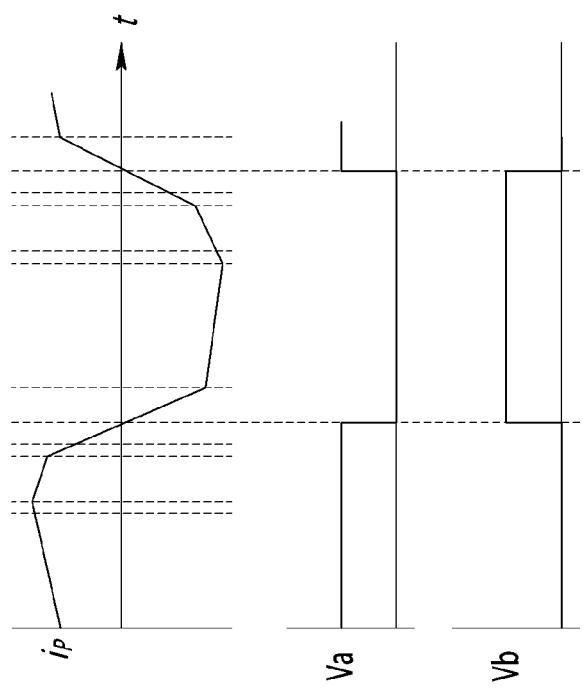

APPARATUS FOR DIAGNOSING DC-DC CONVERTER AND METHOD THEREOF

CROSS-REFERENCE TO RELATED APPLICATION

This application claims priority to and the benefit of Korean Patent Application No. 10-2010-0059782 filed in the Korean Intellectual Property Office on Jun. 23, 2010, the entire contents of which are incorporated herein by reference.

BACKGROUND OF THE INVENTION (a) Field of the Invention

The present invention relates to a diagnosis device of a voltage transformer, and a method thereof.

(b) Description of the Related Art

A DC-DC converter is a voltage transformer that receives a DC voltage and outputs a DC voltage, and may be referred to as one of several types depending on usage.

For instance, a DC-DC converter may be an insulation type or a non-insulation type, depending on an insulation method. Also, a DC-DC converter may be a voltage drop type, a voltage boost type, or a voltage drop/boost type depending on a transformed voltage level.

A DC-DC converter may have a symmetric circuit that receives a regular level of DC voltage input and outputs a regular level of DC voltage, such that power transmission to the output terminal can be achieved by current transformation. A switch typically is disposed to regulate the current flowing, and the switch converts the current flowing direction by on/off operation to a forward direction or a reverse direction. If the current that flows in opposite directions through the on/off operation of the switch has the same transition shape, it is referred to as a DC-DC converter having a symmetric circuit structure. A DC-DC converter having the symmetric circuit structure typically includes a full bridge converter and a half bridge converter. This type of DC-DC converter outputs a symmetric current such that the current is not biased to one side and thereby the current offset value becomes "0".

If the current does not form a symmetric line in such a DC-DC converter, then a current offset is formed, and in this case, a normal voltage cannot be outputted, and as a result, the operation thereof can be halted and the switch can be damaged.

Accordingly, it is important to design the converter such that the current offset is not formed by sustaining a symmetric current.

However, although a current offset may be formed due to a design or manufacturing problem, it is difficult to determine whether the current is symmetric or non-symmetric while it is operating.

Accordingly, if it is suspected that a current offset is formed, a separate measuring apparatus such as an oscilloscope used to measure a wave form can be connected to an output terminal of the DC-DC converter to measure the current of the converter, so as to determine whether a current offset is formed or not.

Accordingly, according to conventional technology, it is difficult to determine whether the DC-DC converter generates a current offset.

The above information disclosed in this Background section is only for enhancement of understanding of the background of the invention and therefore it may contain information that does not form the prior art that is already known in this country to a person of ordinary skill in the art.

SUMMARY OF THE INVENTION

In one aspect, the present invention provides a diagnosis device and method of a voltage transformer in which it is possible to diagnose whether a voltage transformer generates a current offset in real time.

A diagnosis device of a voltage transformer according to an exemplary embodiment of the present invention preferably includes at least: a current transformer disposed at one side of an output port of at least one power switch element for generating a current variation according to an on/off operation of the power switch element; a first current detector configured to detect a forward direction current from the current transformer; a second current detector configured to detect a reverse direction current from the current transformer; a first voltage transformer configured to transform the forward direction current detected from the first current detector to a forward direction voltage; a second voltage transformer configured to transform the reverse direction current detected from the second current detector to a reverse direction voltage; and a diagnosis portion for comparing the forward direction voltage with the reverse direction voltage to determine whether an offset is formed. Further, a display portion may be provided for displaying a result from the diagnosis portion. As provided herein, the diagnosis portion determines whether or not a current offset is formed, which for shorthand purposes is referred to as determining "whether a current offset is formed" or the like.

The current transformer may include a transformer composed of a primary coil and a secondary coil.

The diagnosis portion may compare the forward direction voltage with the reverse direction voltage of which a half cycle thereof has elapsed so as to diagnose whether an offset is formed.

A diagnosis method of a voltage transformer according to an exemplary embodiment of the present invention may include: detecting a forward direction voltage according to an operation of the voltage transformer; detecting a reverse direction voltage, if a half cycle of a voltage transformation has elapsed; and determining whether an offset is formed by comparing the forward direction voltage and the reverse direction voltage.

The diagnosis method may further include determining that an offset is formed when the forward direction voltage and the reverse direction voltage do not coincide with each other. Further, it is possible to output the result as a message.

In an exemplary embodiment of the present invention, whether or not a current offset of a voltage transformer is formed can be diagnosed in real time such that a designer may promptly change a design in a development process and improve reliability thereof.

Such a current offset of the voltage transformer can be diagnosed in real time in a mass production process, which can enhance reliability of a component, for example, through a specification change.

Also, in the exemplary embodiment of the present invention, a serious problem that can occur during operation of a vehicle can be prevented in advance by diagnosing the offset value of the voltage transformer in real time.

BRIEF DESCRIPTION OF THE DRAWINGS

FIG. 3 is a graph depicting an output waveform of a voltage transformer according to an exemplary embodiment of the present invention.

DESCRIPTION OF SYMBOLS

30: current transformer
41, 42: current detector
51, 52: voltage transformer
60: diagnosis portion

DETAILED DESCRIPTION OF PREFERRED EMBODIMENTS

Hereinafter, in the following detailed description, only certain exemplary embodiments of the present invention have been shown and described, simply by way of illustration.

As those skilled in the art would realize, the described embodiments may be modified in various different ways, all without departing from the spirit or scope of the present invention, and the drawings and description are to be regarded as illustrative in nature and not restrictive.

Figure 1:
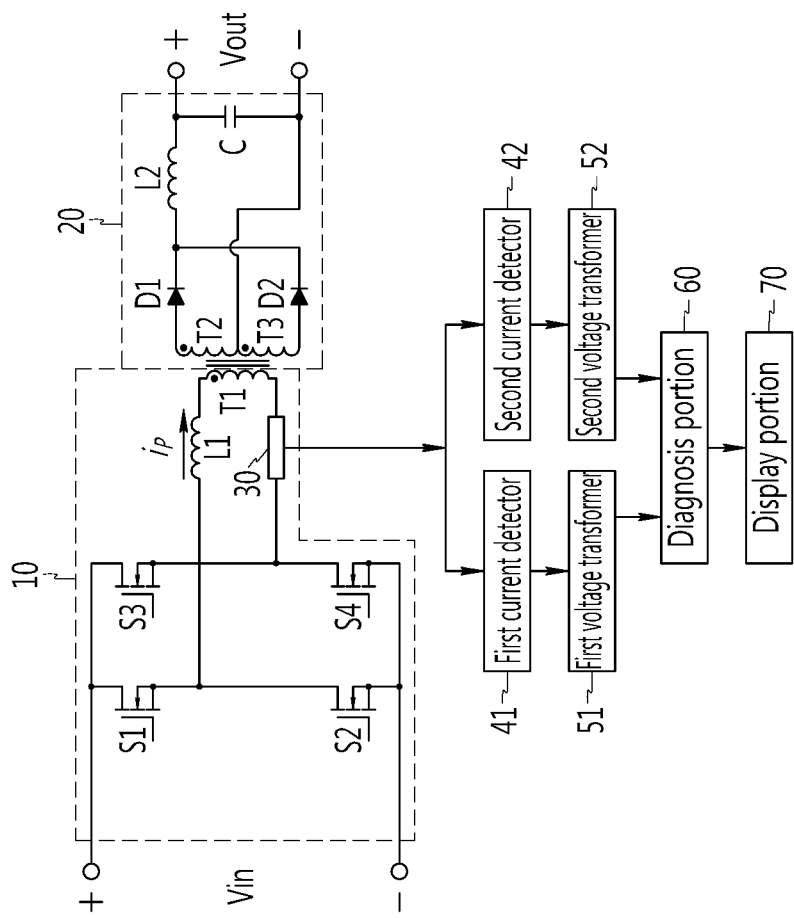
FIG. 1 is a schematic diagram of a diagnosis device of a voltage transformer according to an exemplary embodiment of the present invention.

FIG. 1 is a schematic diagram of a diagnosis device of a voltage transformer according to an exemplary embodiment of the present invention.

Referring to FIG. 1, the diagnosis device according to the present invention preferably includes at least a current transformer 30, a first current detector 41, a second current detector 42, a first voltage transformer 51, a second voltage transformer 52, a diagnosis portion 60, and a display portion 70.

The current transformer 30 preferably is disposed at one side of an output port of an input terminal 10 of at least one power switch element of the voltage transformer and changes a current according to an on/off operation of the at least one power switch element (S1, S2, S3, and S4). As used herein, the term "at least one power switch element" refers to one or more power switch elements, such as the power switch elements (S1, S2, S3, and S4) depicted in FIG. 1. The power switch elements (S1, S2, S3, and S4) can include at least one of a transistor, a MOSFET, and an IGBT.

The current transformer 30 is a transformer preferably including a primary coil and a secondary coil.

The first current detector 41 detects a forward direction current transformed by the current transformer 30.

The second current detector 42 detects a reverse direction current transformed by the current transformer 30.

The first voltage transformer 51 transforms a forward direction current detected by the first current detector 41 to a forward direction voltage.

The second voltage transformer 52 transforms a reverse direction current detected by the second current detector 41 to a reverse voltage.

The diagnosis portion 60 compares the forward direction voltage transferred from the first voltage transformer 51 with the reverse direction voltage transferred from the second voltage transformer 52 and determines whether or not the offset is formed.

Since the reverse direction voltage corresponding to the simultaneous reverse direction voltage is "0", the diagnosis portion 60 determines whether or not an offset is formed after half a switching cycle has elapsed.

The display portion 70 displays a diagnosis result for the offset in a predetermined method according to a control signal transferred from the diagnosis portion 60.

A trouble diagnosis of a voltage transformer including functions as staged above according to the present invention can be performed as follows.

A DC-DC converter according to the present invention boosts or drops inputted DC voltage (Vin) to Vout through the output terminal, and since these operations are performed in a like manner of a conventional voltage transformer, a detailed description thereof will be omitted.

If the DC-DC converter is operated according to the present invention, the inputted DC voltage (Vin) is boosted or dropped to be output through an output port by operations of the power switch elements (S1, S2, S3, and S4).

The current transformer 30 disposed at one side of the output port of the input terminal generates a forward direction current and a reverse direction current according to an on/off operation of the power switch elements (S1, S2, S3, and S4).

If the current generated from the current transformer 30 is a forward direction current, this current is detected by the first current detector 41, and if the current is a reverse direction current, this current is detected by the second current detector 42.

The forward direction current detected by the first current detector 41 is transformed to a forward direction voltage by the first voltage transformer 51 to be transferred to the diagnosis portion 60, and the reverse direction current detected by the second current detector 42 is transformed to a reverse direction voltage by the second voltage transformer 52 to be transferred to the diagnosis portion 60.

Accordingly, the diagnosis portion 60 compares the forward direction voltage transferred from the first voltage transformer 51 with the reverse direction voltage transferred from the second voltage transformer 52, and determined whether or not an offset is formed.

In this case, since the forward direction voltage corresponding to the simultaneous reverse direction voltage is "0" as shown in FIG. 3, the diagnosis portion 60 does not compare the simultaneous value but compares the values with a half difference of the switch cycle so as to determine whether or not the offset is formed, and the display portion 70 displays the diagnosed results in a predetermined method.

Figure 2:
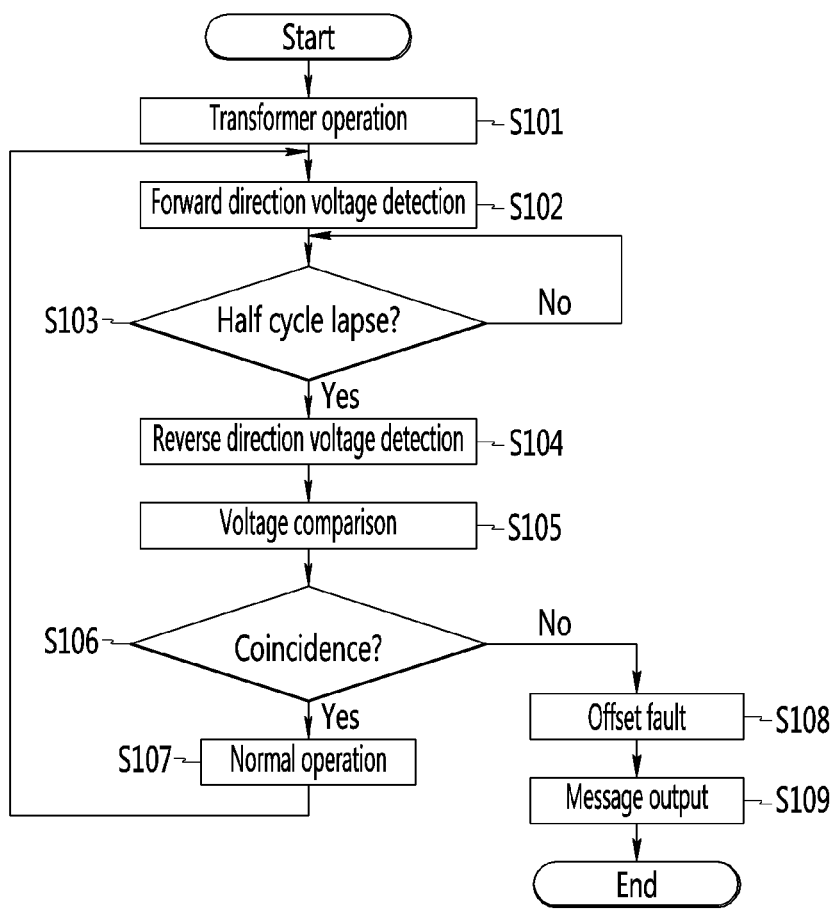
FIG. 2 is a flowchart depicting a diagnosis process of a voltage transformer according to an exemplary embodiment of the present invention.

FIG. 2 is a flowchart depicting a diagnosis process of a voltage transformer according to an exemplary embodiment of the present invention.

Referring to FIG. 2, in the voltage transformer according to the present invention, for instance, if the DC-DC converter is operated in step S101, a varied forward direction voltage is detected according to on/off operation of the power switch element in step S102.

Further, it is determined whether or not half of the voltage variation cycle has elapsed in step S103, and if the half cycle has elapsed, the reverse direction voltage of the power switch element is detected in step S104.

Subsequently, the detected forward direction voltage and the reverse direction voltage are compared with each other and it is determined whether they coincide with each other in step S106.

As a result of step S106, if the forward direction voltage coincides with the reverse direction voltage after the half cycle thereof has elapsed, it is determined that performance is normal and returns to step S102, and the diagnosis is repeated in step S107.

However, as a result of step S106, if the forward direction voltage does not coincide with the reverse direction voltage after the half cycle thereof has elapsed, it is determined that the offset is formed by hardware or software in step S108, and a message thereof can be outputted in step S109.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A diagnosis device of a voltage transformer, comprising:
   at least one power switch element;
   a current transformer disposed at one side of an output port of the at least one power switch element for generating a current variation according to an on/off operation of the power switch element;
   a first current detector configured to detect a forward direction current from the current transformer;
   a second current detector configured to detect a reverse direction current from the current transformer;
   a first voltage transformer configured to transform the forward direction current detected from the first current detector to a forward direction voltage;
   a second voltage transformer configured to transform the reverse direction current detected from the second current detector to a reverse direction voltage; and
   a diagnosis portion for comparing the forward direction voltage with the reverse direction voltage to determine whether an offset is formed.

2. The diagnosis device of claim 1, wherein the current transformer includes a transformer composed of at least a primary coil and a secondary coil.

3. The diagnosis device of claim 1, wherein the diagnosis portion compares the forward direction voltage with the reverse direction voltage of which a half cycle thereof has elapsed so as to diagnose whether the offset is formed.

4. The diagnosis device of claim 1, further comprising:
   a display portion for displaying a result from the diagnosis portion.

* * * * *